United States Patent [19]
Someno et al.

[11] 4,156,196
[45] May 22, 1979

[54] MEMORY SCANNING RADIO RECEIVER WITH SEPARATE CHANNEL DATA SELECTION

[75] Inventors: Noboru Someno, Tokyo; Norio Murata, Komae; Soichi Ohama, Yokohama, all of Japan

[73] Assignee: Sony Corporation, Tokyo, Japan

[21] Appl. No.: 806,672

[22] Filed: Jun. 15, 1977

[30] Foreign Application Priority Data

Jun. 22, 1976 [JP] Japan .................................. 51-73421

[51] Int. Cl.² ............................................. H04B 1/32
[52] U.S. Cl. .................................. 325/419; 325/455; 325/464; 325/470
[58] Field of Search ................ 325/25, 335, 419, 453, 325/464, 468, 470, 455

[56] References Cited

U.S. PATENT DOCUMENTS

| 3,961,261 | 6/1976 | Pflasterer | 325/470 |
| 3,999,131 | 12/1976 | Fukuda et al. | 325/470 |
| 4,011,515 | 3/1977 | Hanson | 325/470 |
| 4,027,251 | 5/1977 | Fathauer et al. | 325/470 |
| 4,031,473 | 6/1977 | Mitarai | 325/455 |
| 4,057,760 | 11/1977 | Koch | 325/470 |

OTHER PUBLICATIONS

Heath's Digital FM Tuner—David M. Thomas—Radio Electronics, May 1973, pp. 42-50, 98.

*Primary Examiner*—Robert L. Griffin
*Assistant Examiner*—Marc E. Bookbinder
*Attorney, Agent, or Firm*—Hill, Gross, Simpson, Van Santen, Steadman, Chiara & Simpson

[57] ABSTRACT

A radio receiver having RF, frequency converter, demodulator and audio stages, in which the frequency converter stage is connected to a local oscillator composed of a phase locked loop. The radio receiver includes a variable frequency divider inserted into the phase locked loop, a memory circuit for variably controlling the frequency dividing ratio of the frequency divider in accordance with a signal to be received, a scanning counter for supplying a read-out control signal to the memory circuit, a clock signal source for generating a clock signal, a counter control circuit for controlling supply and supply-terminating of the clock signal fed to the scanning counter, a level detecting circuit for detecting if a signal supplied to the RF stage has a level higher than a predetermined level, a switching circuit for switching a received channel, and a circuit for cutting off the clock signal fed to the scanning counter when outputs of the switching circuit and level detecting circuit are fed thereto.

7 Claims, 6 Drawing Figures

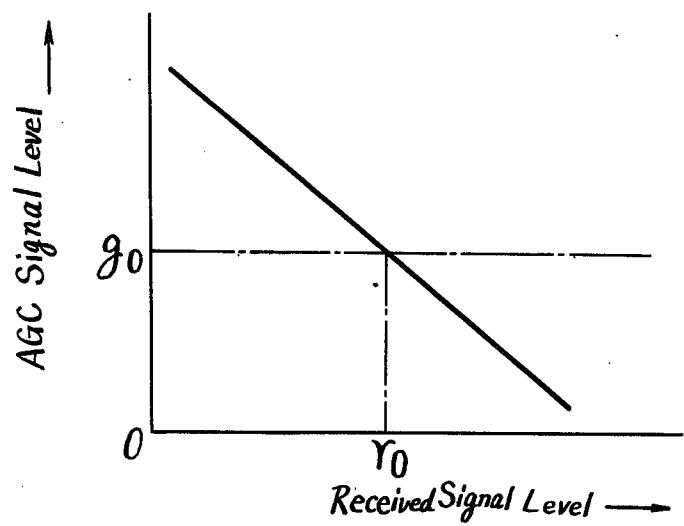
Fig. 2
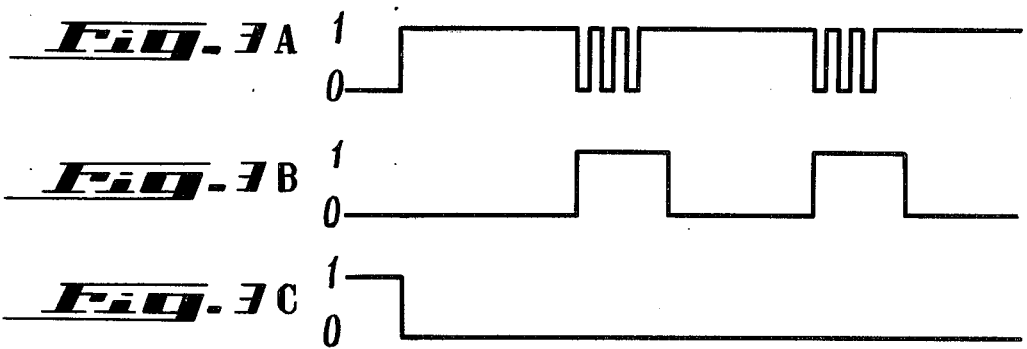
Fig. 3A
Fig. 3B
Fig. 3C

Fig. 4

| NO | CD | SQ | QA | HL | T/R | UL | Display |
|---|---|---|---|---|---|---|---|
| 0  | 0 | 0 | 0 | 0 | 0 | 1 | ON and OFF |
| 1  | 1 | 0 | 0 | 0 | 0 | 1 | " |
| 2  | 0 | 1 | 0 | 0 | 0 | 1 | " |
| 3  | 1 | 1 | 0 | 0 | 0 | 1 | ON |
| 4  | 0 | 0 | 1 | 0 | 0 | 1 | OFF |
| 5  | 1 | 0 | 1 | 0 | 0 | 1 | " |
| 6  | 0 | 1 | 1 | 0 | 0 | 1 | " |
| 7  | 1 | 1 | 1 | 0 | 0 | 1 | " |
| 8  | 0 | 0 | 0 | 1 | 0 | 1 | " |
| 9  | 1 | 0 | 0 | 1 | 0 | 1 | " |
| 10 | 0 | 1 | 0 | 1 | 0 | 1 | " |
| 11 | 1 | 1 | 0 | 1 | 0 | 1 | " |
| 12 | 0 | 0 | 1 | 1 | 0 | 1 | " |
| 13 | 1 | 0 | 1 | 1 | 0 | 1 | " |
| 14 | 0 | 1 | 1 | 1 | 0 | 1 | " |
| 15 | 1 | 1 | 1 | 1 | 0 | 1 | " |
| 16 |   |   |   | 1 | 1 | 1 | " |
| ∫  |   |   |   | ∫ | ∫ | ∫ | ∫ |
| 31 |   |   |   | 1 | 1 | 1 | " |

MEMORY SCANNING RADIO RECEIVER WITH SEPARATE CHANNEL DATA SELECTION

BACKGROUND OF THE INVENTION

1. Field of the Invention

The present invention relates generally to a radio receiver, and is directed more particularly to a radio receiver of a heterodyne type.

2. Description of the Prior Art

Recently, the number of communication stations which utilize transmitting and receiving apparatus and the like has increased. Even so, it has sometimes been difficult to find an opposite station. To avoid this difficulty, some radio receivers have recently been equipped with an automatic station selecting device which performs a so-called automatic scanning function which sweeps channels or stations to automatically select a desired channel. The automatic sweeping and stopping is controlled by detecting the existence or non-existence of a sensed signal in the desired channel. In the conventional receiver, the discrimination is carried out by the control signal which is obtained by, for example, an IF signal. The above discrimination, however, is only possible in the existence of the IF signal. Thus, the conventional receiver may receive such a signal as a weak electric field or the signal may contain much noise and is difficult to be heard. For example, if a noise whose frequency is the same as that of an IF signal is accidentally present in a receiver during a short period of time, the receiver is tuned to the frequency even though there is no signal to be received.

SUMMARY OF THE INVENTION

An object of the present invention is to provide a radio receiver in which a channel-to-channel switching can be automatically performed during reception and, when the level of a received signal is higher than a predetermined value, the channel is fixed or locked. In this case, even if channel 3 is fixed to for example, a specific channel can be automatically switched to, for example channel 1. Further, if the switching condition to the specific channel is released, since the read-out signal corresponding to channel 3 is stored in a scanning counter, the receiver can be switched to the previous channel 3 even when the level of a received signal at channel 1 is lower than a predetermined value or not.

Another object of the invention is to provide a radio receiver in which if a channel is switched to automatically during reception, further channel switching will not result even if the level of a received signal higher than a predetermined value becomes lower than the predetermined value during a predetermined time period.

A further object of the invention is to provide a radio receiver in which if the receiver is automatically switched from channel to channel during signal reception, a predetermined value of the level of a received signal for fixing or switching a channel can be adjusted at the same time that a predetermined value of a received signal for muting a low frequency signal is adjusted.

Another object of the invention is to provide a radio receiver in which when the receiver is automatically switched from channel to channel, if the receiver is changed to a signal transmission condition, that channel is fixed, and if the receiver is again changed to a signal reception condition, that channel is fixed. At this time, in order to begin automatic channel switching, the operation therefor must be again carried out.

According to an aspect of the present invention there is provided a radio receiver having RF, frequency converter, demodulator and audio stages. The frequency converter stage is connected to a local oscillator which is constructed with a phase locked loop. The radio receiver comprises a variable frequency divider inserted into the phase locked loop, a memory circuit for variably controlling the frequency dividing ratio of the frequency divider in accordance with a signal to be received, a scanning counter for supplying a read-out control signal to the memory circuit, a clock signal source for generating a clock signal, a counter control circuit for controlling the supply and supply-stop of the clock signal to the scanning counter, a level detecting circuit for detecting if a signal supplied to the RF stage has a level higher than a predetermined level, a switching circuit for switching a received channel, and a circuit for cutting off the clock signal fed to the scanning counter when outputs of the switching circuit and level detecting circuit are fed thereto.

The other objects, features and advantages of the present invention will become apparent from the following description taken in conjunction with the accompanying drawings.

BRIEF DESCRIPTION OF THE DRAWINGS

FIG. 2 is a characteristic curve of signals used in the invention;

FIGS. 3A, 3B and 3C are waveform diagrams; and

FIG. 4 is a truth table.

DESCRIPTION OF THE PREFERRED EMBODIMENT

Figure 1:
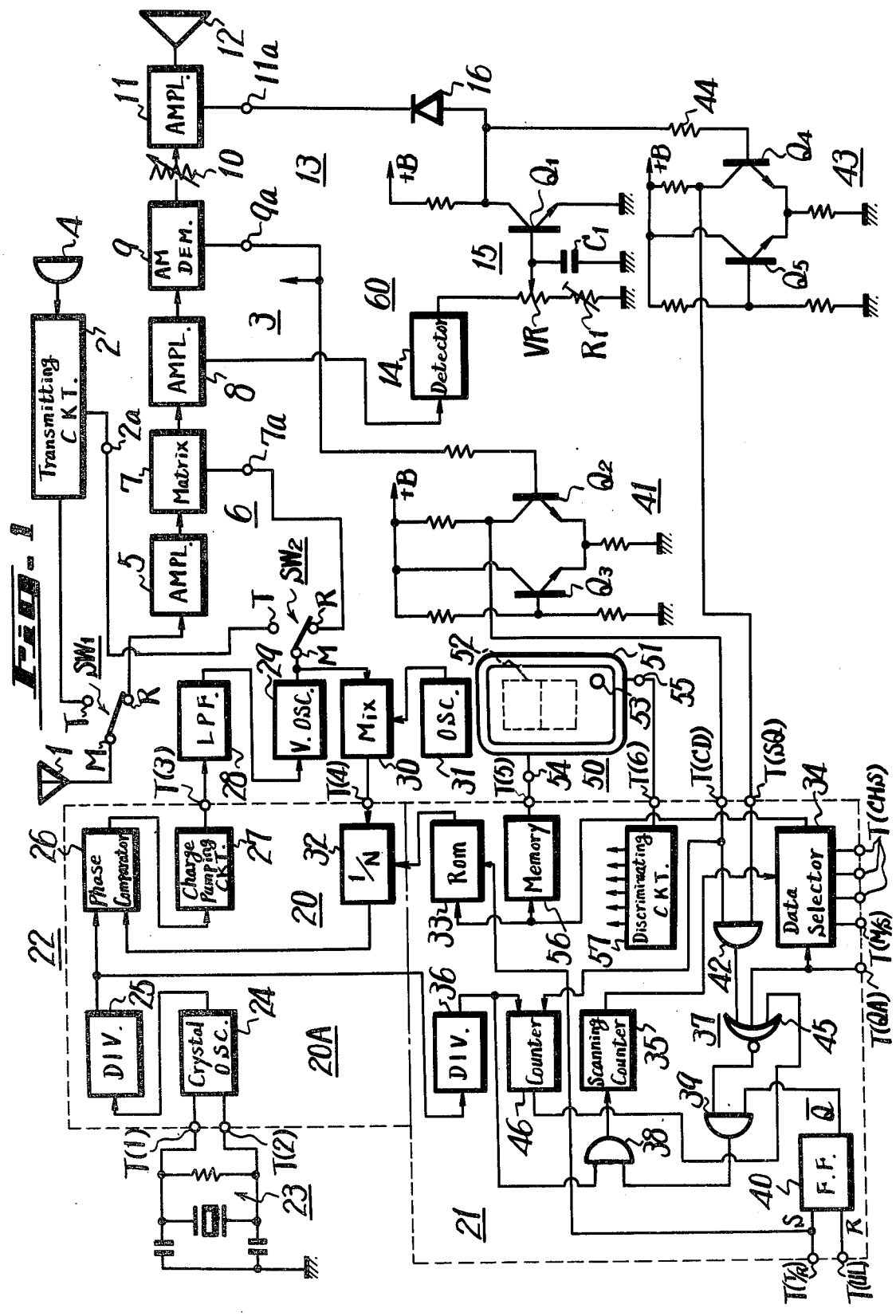
FIG. 1 is a block diagram showing an embodiment of the invention which is applied to a transceiver, for example.

Referring now to FIG. 1, there is illustrated one embodiment of the invention applied to a transceiver as a transmitting and receiving system. The transceiver according to the embodiment of FIG. 1 is an AM transmitting and receiving system for the 27 MHz citizen band in Japan.

In FIG. 1, numeral 1 designates a transmitting and receiving antenna, which is connected through a duplex switch $SW_1$ to a transmitting circuit 2 and a receiving circuit 3, respectively. The switch $SW_1$ has a movable contact M coupled to antenna 1, and fixed contacts T and R on the transmission and reception sides, respectively.

The transmitting circuit 2, though not shown in its practical arrangement, is designed so that a carrier signal supplied to its input terminal shown at 2a can be amplitude-modulated by a sound signal from a microphone 4 and the amplitude-modulated signal delivered through a switch $SW_1$ to antenna 1.

The receiving circuit 3 has a reception signal system 13 that is composed of a high-frequency amplifier 5, a matrix or mixer 7 which forms a frequency converter 6, an intermediate-frequency amplifier 8, an AM demodulator 9, a volume controller (a variable resistor) 10, a low-frequency amplifier 11 and a loudspeaker 12. In this illustration, antenna 1 is coupled through switch $SW_1$ to the input end of high-frequency amplifier 5. The mixer 7 is supplied with a local oscillation signal from an input terminal 7a, and the AM demodulator 9 has an AGC signal output terminal 9a, from which an AGC (automatic gain control) signal is fed to high-frequency amplifier 5 and/or intermediate-frequency amplifier 8. A part of the intermediate-frequency signal from intermediate frequency amplifier 8 is fed to a received-signal level detector (for example, a rectifier) 14, the output of which is applied to a muting controller 15, which delivers its output through a diode 16 to a muting signal input terminal 11a of low-frequency amplifier 11.

The controller 15 is arranged so that the detected signal derived from detector 14, after being voltage-divided by a muting level controller, a variable resistor VR as a variable means for changing a predetermined value of the received signal level and a semifixed resistor $R_1$, is partially applied to the base of an emitter-grounded switching transistor $Q_1$ which develops at its collector a muting signal to be fed through diode 16 to input terminal 11a. In this respect, B+ indicates a power source, and $C_1$ a large-value capacitor for smoothing (integrating) which is connected between the base of transistor $Q_1$ and ground.

The received signal level detector 14 and controller 15 constitute a level detecting means 60 for detecting whether the level of the received signal is higher or lower than a predetermined value. Shown at 20 is a local oscillator of a PLL (phase-locked loop) frequency synthesizer configuration, which is designed to supply its oscillation signal through another similar duplex switch $SW_2$ which is in association with switch $SW_1$ to the input terminal 2a of transmitting circuit 2 as a carrier signal, and also to the input terminal 7a of mixer 7 included in the reception signal system 13 of receiving circuit 3 as a local oscillation signal, respectively.

Shown at 21 is a controller for controlling mainly the aforesaid local oscillator 20, a portion 20A of which is combined with the controller 21 to form a single semiconductor integrated circuit 22 as indicated by a broken line. The portion 20A of oscillator 20 and the controller 21 are partitioned by a broken line as illustrated. Characters T(1) to T(6), T(T/R), T(UL), T(QA), T(M/S), T(CHS), T(CD) and T(SQ) on the broken line each represents an external terminal of semiconductor integrated circuit 22.

Now, let the local oscillator 20 be explained. An external circuit 23 including a crystal resonator is connected through terminals T(1) and T(2) to a crystal oscillator (a fixed oscillator oscillating at 8.192 $MH_z$)24, the oscillation output of which is supplied to a frequency divider 25 of dividing ratio 1/M (=1/1024). As a result, an 8-$kH_z$ signal in this case is fed therefrom to a phase comparator 26, the output of which is applied to a voltage-control type variable oscillator 29 through a charge pumping circuit 27, the external terminal T(3) and a low-pass filter 28, as an oscillation-frequency controlling signal. The charge pumping circuit 27 is formed by a series circuit of, for example, P- and N-channel MOS field effect transistors connected to a DC voltage source, the gates of which are each supplied with a compared output showing the lead or lag of phase from phase comparator 26, and the output of which, having a reverse polarity according to the lead and lag of phase, is supplied from the junction point of both transistors to low-pass filter 28. The oscillation output of the oscillator 29 is fed to a mixer 30 where it is mixed with the oscillation output from a crystal oscillator (or a fixed oscillator oscillating at 26.008 $MH_z$) 31 to produce a 0.96-$MH_z$ signal as a difference between the oscillation frequencies of oscillators 29 and 31. This signal is applied through external terminal T(4) to a 1/N-variable frequency divider (or a programmable frequency divider) 32 so as to be divided in frequency. The divided output therefrom is fed to the above mentioned phase comparator 26.

If, by way of example, the 27-$MH_z$ citizen band is allowed to include 8 channels, then the dividing ratio, 1/N of variable frequency divider 32 is varied 8 ways for each transmission and reception, or in a total of 16 ways. In this case, the value of dividing ration 1/N varies upon transmission and reception even for the same channel. A signal of a frequency determined by the dividing ratio 1/N of variable frequency divider 32 is applied from variable oscillator 29 through switch $SW_2$ either to transmitting or receiving circuit 2 or 3 as a carrier or local oscillation signal, respectively. The control signal for changing the dividing ratio 1/N of the variable frequency divider 32 is fed thereto from the controller 21, which will be described later.

The controller 21 will now be discussed. Shown at 33 is a fixed memory (ROM: read-only memory) for changing the dividing ratio 1/N of variable frequency divider 32 and which has stored therein the information of 16 types of dividing ratio 1/N for the variable frequency divider 32 mentioned above. To this memory 33 is supplied a read control signal from a data selector 34 as described later and also a transmission and reception discriminating signal from the input terminal T(T/R) therefor.

The input terminals T(CHS) led out from the data selector 34 are used to receive a three-bit binary coded signal corresponding to the number of a channel which is manually selected from the eight channels 1 to 8 at the time of transmission or reception.

Shown at 35 is a scanning counter that is designed so that upon reception, the eight channels 1 to 8 can be successively continuously changed over in turn by altering the dividing ratio of variable frequency divider 32, the output of the counter being supplied through data selector 34 to memory 33. The scanning counter 35 consists of three flip-flop circuits, the outputs of which are combined to produce a three-bit binary coded signal corresponding to one of the channels 1 to 8. In addition, the counter 35 is supplied with a 2-$H_z$ clock signal that is obtained by applying the 8-$kH_z$ signal from frequency divider 25 further to a frequency divider 36 of dividing ratio 1/W (in this case, 1/4000).

Shown at 37 is a counter control circuit for controlling the supply and cut-off of clock signals to counter 35, as will be described later. The output of frequency divider 36 is fed to counter 35 through an AND circuit 38, to which the output of an AND circuit 39 is applied as a gate signal.

Shown at 40 is an RS flip-flop circuit as a discrimination circuit the output of which becomes "0" when the transceiver is in a transmitting condition, "0" when it is switched from transmitting to a receiving condition, and "1" when it is in a receiving condition and the channels are successively changed over. In addition, the flip-flop circuit 40 has two input terminals, one of which is supplied with a set signal S and the other one of which is supplied with a reset signal R, the former input terminal being connected to the transmission and reception discriminating signal input terminal T(T/R), the latter input terminal being coupled to the input terminal T(UL) for an unlocking signal that indicates to successively switch from channel to channel. Furthermore, the output $\overline{Q}$ of flip-flop circuit 40 is supplied to AND circuit 39. The signal fed to input terminal T(T/R)

becomes "1" under a transmitting condition and "0" under a receiving condition, while the signal fed to input terminal T(UL) becomes "1" when the channels are successively switched and "0" if this is not the case.

Furthermore, in the presence of the unlocking signal of "1" at input terminal T(UL), when the received signal level in a switched channel is higher than a predetermined value, the automatic switching operation stops at that channel, but when it is lower than the predetermined value, the switching operation continues. For this purpose, the following circuitry is employed. The output from the AGC signal output terminal 9a is fed to the base of transistor $Q_2$ of a differential amplifying circuit 41 that has transistors $Q_2$ and $Q_3$. The output of transistor $Q_2$ is supplied from its collector to an AND circuit 42 through input terminal T(CD) that is used to receive a signal for detecting the presence or absence of received signals. Also, the output of transistor $Q_1$ of muting control 15 is connected from its collector through a resistor 44 to the base of a transistor $Q_4$ of a differential amplifying circuit 43 having transistors $Q_4$ and $Q_5$. The output of the transistor $Q_4$ is applied from its collector through the squelch signal input terminal T(SQ) to AND circuit 42, the output of which is fed in turn to a NOR circuit 45.

The response curve of the AGC signal to the received signal obtained from output terminal 9a is shown in FIG. 2, from which it will be understood that as the received signal increases in level, the AGC signal level decreases. In this case, when the received signal level is smaller than a predetermined value $r_o$, the received signal is regarded as being absent, whereas the received signal, when it is higher in level than $r_o$, is regarded as being present. In addition, it is assumed that the AGC signal level corresponding to the received signal level $r_o$ is $g_o$. Thus, when no received signal is present, i.e., when the AGC signal is larger than $g_o$, the transistor $Q_2$ of differential amplifying circuit 41 is turned on to supply signal "0" to AND circuit 42. When a received signal is present, that is, when the AGC signal level is smaller than $g_o$, the transistor $Q_2$ is turned off to apply signal "1" to AND circuit 42.

Further, transistor $Q_1$ of muting controller 15 generates a muting signal at its collector under the control of a threshold level set by adjusting variable resistor VR. That is, when a received signal is smaller than a predetermined level, then transistor $Q_1$ is turned off to provide muting for low-frequency amplifier 11, and also transistor $Q_4$ is turned on to supply signal "0" to AND circuit 42. On the contrary, when a received signal is larger than a predetermined level, transistor $Q_1$ is turned on to release the low-frequency amplifier 11 from the muting, and also transistor $Q_4$ is turned off to supply signal "1" to AND circuit 42.

Consequently, the AND circuit 42 produces output signal "1" when a received signal is present and its level is larger than a predetermined value. The output signal "1" is then fed to NOR circuit 45, the output of which is applied as a signal "0" to AND circuit 39.

The input terminal T(M/S) connected to data selector 34 is used to receive a manual or automatic switching signal that serves to choose either the manual channel selection or the automatic sequential channel selection. When the input terminal T(M/S) receives the above signal, a read control signal to be supplied from data selector 34 to fixed memory 33 is selected from signals that are fed from input terminal T(CHS) or scanning counter 35.

Further, the terminal T(QA) is used to receive a specific channel switching signal that, under automatic, continuous changeover of channels, serves to select a specific channel, for example, channel 1 by automatic switching. The input signal "1" from the above terminal T(QA) is delivered to data selector 34 and NOR circuit 45, respectively. When the input signal "1" is fed to NOR circuit 45, the NOR circuit 45 produces output signal "0," which is supplied to AND circuit 39. In this case, the data selector 34 supplies a read control signal for channel 1 preset beforehand in the data selector 34 to fixed memory 33, but the scanning counter 35 is not supplied with a clock signal. For this reason, the scanning counter 35 stores a binary coded signal corresponding to the channel at that time, for example, channel 3. When a specific channel switching signal is not supplied to input terminal T(QA), then the read out signal from scanning counter 35 is fed through data selector 34 to fixed memory 33. That is, the change over to channel 3 is again performed. In this case, when a received signal level is higher than a predetermined value, channel 3 is fixed, but the received signal, when it is less than a predetermined value, permits the channel selection to be continuously performed in turn from channel 3 to 4, 5 to 6, etc.

Under a receiving condition, when the channel selection is automatically performed and when a certain channel is fixed because the received signal level is higher than a predetermined value, there is a fear that the temporary interruption of the received signal will cause the output signal of AND circuit 42 to become "0" and hence scanning counter 35 starts to count for automatic changeover of channels. To prevent the above possibility, the channel selection is allowed not to occur even if a received signal is interrupted for a predetermined time period, for example, less than three seconds. Therefore, as a time detecting circuit for detecting such a time interval, a counter 46 is provided that is supplied with a 2 $H_z$ signal from frequency divider 36 so as to count for three seconds. The counter 46, when a received signal disappears, i.e., when an input signal to input terminal T(CD) becomes "0" as shown in FIG. 3A, starts to count and after three seconds stops counting with its state being reset. As illustrated in FIG. 3B, the output signal "1" is produced for the time interval of three seconds from the counter 46. The output of the counter 46 is fed to NOR circuit 45, which produces the output as shown in FIG. 3C. Thus, even when the input signal to be fed to input terminal T(CD) temporarily becomes "0," the scanning counter 35 does not count unless the "0" state duration exceeds three seconds, and hence there is no channel changeover.

Now, a display device 50 will be described that indicates the changed-over channel and channel switching condition. Shown at 51 is an indicator, and at 52 an indicating portion that displays the changing condition of channels 1 to 8, and that is composed of a display element such, for example, as a light emitting diode of a modified 8 shape. The indicating portion 52 changes its display by a display driving signal supplied to an input terminal 54. Therefore, a memory 56 such as a read-only memory (ROM) is provided that is controlled by a signal from data selector 34 to produce a display driving signal corresponding to the channel fixed by switching upon transmission and reception, which display driving signal is fed through external terminal T(5) to input terminal 54.

Shown at 53 is an indicating portion that displays the channel change-over condition and is composed of a display element such, for example, as a light emitting diode of dot shape. The indicating portion 53 is driven by a display driving signal supplied to an input terminal 55. For this reason, a discriminating circuit 57 including logic circuits and the like is provided that is supplied with various kinds of signals to be discriminated which will be described later, and delivers the discriminated output through external terminal T(6) to input terminal 55. The indicating portion 53 gives intermittent lighting when the channel change-over is automatically performed in turn with the scanning counter 35 being in operation, and the same is continuously lit when a received signal level is higher than a predetermined value during an automatic switching condition of channels, i.e., when a certain channel is fixed with the scanning counter 35 being stopped, except for its extinguishment in the other case.

The display state of the indicating portion 53 is determined by the logic in the truth values as shown in FIG. 4. Here, column NO represents the situation numbers and column CD input signals fed to the input terminal T(CD) that receives a signal for detecting the presence or absence of a received signal, the input signal being "1" in the presence of a received signal but "0" in the absence thereof. Furthermore, column SQ shows input signals that are applied to squelch signal input terminal T(SQ), the input signal being "1" when a received signal is higher than a predetermined value but "0" when it is less than that. Column QA represents signals that are applied to a specific-channel switching signal input terminal—the signal being "1" when a specific-channel change-over is carried out but "0" if not so. Column HL shows signals that are "1" when the transceiver is under transmitting condition, but "0" when the channel change-over is performed continuously in turn. Column T/R are transmission and reception discriminating signals that are "1" upon transmission but "0" upon reception, and column UL are unlocking signals that are applied to input terminal T(UL)—the unlock signal being "1" when the channel change-over is performed continuously in turn but "0" if not so.

This transceiver described above is able to automatically change over the channels upon reception. When a received signal is higher in level than a predetermined value, the corresponding channel is fixed. At this time, when channel 3 for example, is fixed, it is possible to carry out the automatic change-over to a specific channel, for example, channel 1. If the changed-over state to a specific channel is released, since the scanning counter 35 contains a read signal corresponding to channel 3, the previous channel 3 can be switched back to regardless of whether a received signal in the channel 1 is lower than a predetermined value or not.

If the case of automatic channel change-over upon reception, even when a received signal level higher than a predetermined value decreases below a fixed value during a predetermined time or less, the channel change-over does not occur.

When the channel change-over is automatically performed during a receiving condition, a predetermined value of a receiving signal level can be changed thereby to cause the previous channel to remain fixed or be changed. Such a change of a predetermined value of a receiving signal level can be achieved simultaneously with that for muting low-frequency signals.

When the transceiver, during automatic channel change-over during reception, changes its receiving state to a transmitting state, the previous channel remains fixed. When the transceiver again changes the above state to reception, the above fixed channel remains unchanged. At this time, to again institute automatic channel change-over, it is necessary to again perform the necessary operation.

While the above description has applied the invention to a transceiver as a transmitting and receiving system, the system and construction of the transceiver may be arbitrarily provided and the invention can be also applied to a receiver for its exclusive use.

In accordance with the invention described above, in a heterodyne receiver that is capable of automatic channel change-over such that the continuous channel change-over is performed successively when a received signal is lower in level than a predetermined value and that the corresponding channel is fixed when the level thereof is higher than a predetermined value, a specific channel can be temporarily fixed during the automatic channel change-over, and also, irrespective of the level of a received signal in the specific channel, the original channel can be fixed again by switching after the release of the specific channel, with the start of automatic channel change-over being possible from that channel. In addition, since the scanning counter is provided with the counter control circuit for controlling the supply and cut-off of supply of clock signals to the scanning counter, the scanning counter can also be used as a memory. Thus, the invention is simple in construction as compared with the case where a means for storing the channels upon automatic channel change-over is provided besides the scanning counter.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. In a radio receiver having RF, frequency converter, demodulator and audio stages, said frequency converter stage being connected to a local oscillator which is controlled by a phase locked loop, said radio receiver comprising:
   (a) a variable frequency divider inserted into said phase locked loop;
   (b) memory means for variably controlling a frequency dividing ratio of said frequency divider in accordance with a read-out control signal;
   (c) a scanning counter means for supplying a sequence pattern of read-out control signals to said memory means;
   (d) a clock signal source for generating a clock signal which is fed to said scanning counter means;
   (e) a counter control circuit means for controlling supply and supply-stop of said clock signal fed to said scanning counter means;
   (f) a level detecting means connected to the counter control circuit means for detecting that a signal supplied to said RF stage has a level higher than a predetermined level;
   (g) pre-programmed data selection means for selecting a pre-programmed received channel and connected to said memory means;
   (h) said counter control circuit means stopping clock signal feed in dependence upon an output signal from the level detecting means or if the data selection means is activated for automatically selecting the pre-programmed channel; and (i) said scanning counter means stopping the sequence pattern of read-out control signals when clock signal feed stops and resuming the sequence pattern at the point of stopping when clock signal feed resumes such that when the pre-programmed data selection means is deactivated, a last-scanned channel occurring at the time of the activation of the data selection means will be directly returned to.

2. A radio receiver according to claim 1 further comprising means for varying said predetermined level of said level detecting means, whereby even weak broadcasting waves can be received.

3. A radio receiver according to claim 1 further comprising muting means which is connected to said level detecting means whereby a signal of at least said audio stage is cut off when a level of a received signal is lower than a predetermined level.

4. A radio receiver according to claim 1 further comprising means connected to an output of said level detecting means for detecting that an output of said level detecting means is not present for a time greater than a predetermined time period, and means for supplying said clock signal to said scanning counter means when said predetermined time period is exceeded and the output of the level detecting means is not present.

5. A radio receiver according to claim 1 further comprising display means which is responsive to at least an output of said level detecting means and an output of said scanning counter means, said display means being lit intermittently when both of said outputs are present and continuously lit when said level detecting means produces an output but said scanning counter produces no output.

6. The receiver of claim 1 in which the scanning counter means connects to the memory means through the pre-programmed data selection means, and a manual switch means for creating manual read-out control signals is connected to said pre-programmed data selection means, said pre-programmed data selection means blocking feed of the read-out control signals from the scanning counter means to the memory means and permitting the manual read-out control signals to pass from the manual switch means to the memory means.

7. The receiver of claim 1 in which the radio receiver has an AGC output and circuit means connecting the AGC output to the counter control circuit means, said counter control circuit means stopping clock signal feed when output signals are simultaneously received from said circuit means and level detecting means.

* * * * *